(12) United States Patent
Firth et al.

(10) Patent No.: US 8,908,726 B2
(45) Date of Patent: Dec. 9, 2014

(54) ENCLOSURE FOR A LASER PACKAGE

(75) Inventors: Paul Firth, Caswell Towcester (GB); Stephan Gardner, Caswell Towcester (GB)

(73) Assignee: Oclaro Technology Limited, Northamptonshire (GB)

( * ) Notice: Subject to any disclaimer, the term of this patent is extended or adjusted under 35 U.S.C. 154(b) by 0 days.

(21) Appl. No.: 13/812,129

(22) PCT Filed: Aug. 1, 2011

(86) PCT No.: PCT/GB2011/051453
§ 371 (c)(1),
(2), (4) Date: Jan. 24, 2013

(87) PCT Pub. No.: WO2012/013988
PCT Pub. Date: Feb. 2, 2012

(65) Prior Publication Data
US 2013/0114629 A1    May 9, 2013

(30) Foreign Application Priority Data

Jul. 30, 2010   (GB) .................................... 1012829.6

(51) Int. Cl.
| | | |
|---|---|---|
| *H01S 3/04* | (2006.01) | |
| *H01S 5/022* | (2006.01) | |
| *H01S 3/10* | (2006.01) | |
| *G02B 6/42* | (2006.01) | |
| *H01S 5/024* | (2006.01) | |
| *H01S 5/042* | (2006.01) | |

(52) U.S. Cl.
CPC ............... *H01S 3/10* (2013.01); *H01S 5/02438* (2013.01); *H01S 5/02208* (2013.01); *H01S 5/02276* (2013.01); *H01S 5/0427* (2013.01); *H01S 5/02415* (2013.01); *H01S 5/02284* (2013.01); *G02B 6/4201* (2013.01)
USPC .............................................. 372/34; 372/20

(58) Field of Classification Search
CPC . H01S 5/02208; H01S 5/02284; H01S 5/022; H01S 5/02438; H01S 5/02446; H01S 5/02469
USPC ...................................................... 372/34, 20
See application file for complete search history.

(56) References Cited

U.S. PATENT DOCUMENTS

| 4,689,740 | A | 8/1987 | Moelands et al. |
| 7,415,923 | B2 | 8/2008 | Starrett et al. |
| 2006/0013542 | A1* | 1/2006 | Schunk ............................ 385/92 |
| 2007/0013989 | A1* | 1/2007 | Lim .............................. 359/223 |

FOREIGN PATENT DOCUMENTS

| EP | 1 986 028 A2 | 10/2008 |
| GB | 2 405 532 A | 3/2005 |
| JP | 2001 313438 A | 9/2001 |

OTHER PUBLICATIONS

PCT International Search Report and Written Opinion, Application No. PCT/GB2011/051453 dated Nov. 29, 2011, 13 pages.

* cited by examiner

*Primary Examiner* — Kinam Park
(74) *Attorney, Agent, or Firm* — Fenwick & West LLP (57) ABSTRACT

An enclosure for a laser package the enclosure being configured to receive a laser component within the enclosure, and further configured to receive for a driver integrated circuit (IC) (34) on the exterior of the enclosure, wherein the enclosure comprises first external electrical contacts (52) electrically connected to respective first IC electrical contacts (60), and second IC electrical contacts (62) electrically connected to respective first internal electrical contacts (64), wherein the first and second IC electrical contacts (60, 62) are configured for electrical connection to the driver IC (34). Heat dissipation of the driver IC is improved for the IC being mounted outside of the enclosure.

13 Claims, 7 Drawing Sheets

ENCLOSURE FOR A LASER PACKAGE

FIELD OF THE INVENTION

The present invention relates generally to the field of laser packages, such as those forming transmitter optical subassemblies (TOSAs) in optical transceivers and particularly, though not exclusively, to those forming tunable TOSAs and enclosures for forming such laser packages.

BACKGROUND OF THE INVENTION

Optical transceivers employ laser packages, such as TOSAs to achieve telecommunication and high speed data communication channels. A standard for optical transceivers, called XFP (10 gigabit small form factor, pluggable) requires that compliant optical transceivers be hot-swappable, protocol independent, and operable at wavelengths of approximately 850, 1310, and 1550 nm in single or multi-mode at nominal data rates of 9.95 G b/s upwards. In telecommunications applications, such transceivers can be used for SONET OC-192 and G.709 "OTU-2", whilst for data communication they can be used for the transmission of 10 Gb/s optical signals by optical fibre, and 10 Gb/s Ethernet, though the forgoing is not an exhaustive list. The XFP specification was created by the XFP Multi-Source Agreement Group (MSA).

The MSA specification for XFP specifies physical dimensions of both the optical transceiver itself and the cage within which the optical transceiver is received, which cage is mounted on a printed circuit board (PCB). These physical dimension restraints must be borne in mind when the optical transceivers are designed, and act as a limiting feature on the evolution of the circuitry contained within the optical transceiver module. The enclosure for the laser package (e.g. an XFP laser package) is typically elongate with a generally flat walls between a first end with an optical fibre connection and a second end with a projecting arrangement of input/output pins or electrical contacts.

One component of an optical transceiver is a TOSA, which is operable to transmit data via an optical output. A tunable TOSA is one that is controllable to output light at different wavelengths. However, in order to operate more advanced wavelength tunable lasers within a TOSA that have a broad wavelength tuning range, it is necessary to provide the tunable TOSA with additional input channels by which additional control data may be received to select the desired wavelength. These additional input channels complicate compliance with the XFP standard because they necessitate additional connection pins through which the tunable TOSA is connectable to the circuitry of the optical transceiver and because the additional connections to the tunable TOSA increase the physical dimensions thereof. One method of mitigating this issue is the inclusion within the enclosure of a driver IC that is able to translate serialised control data, received from a single data line, into the necessitated multiple parallel control lines required to operate the tunable TOSA. This, however, raises the additional problem of taking up additional space within the enclosure of the TOSA itself. Further, such driver ICs generate heat, which is difficult to remove from within the enclosure.

The present invention seeks to overcome or at least mitigate the aforementioned issues to provide laser packages that maximise the internal volume.

SUMMARY OF INVENTION

According to a first aspect, there is provided an enclosure for a laser package, the enclosure being configured to receive a laser component within the enclosure, and further configured to receive a driver integrated circuit (IC) on the exterior of the enclosure, wherein the enclosure comprises first external electrical contacts electrically connected to respective first IC electrical contacts, and second IC electrical contacts electrically connected to respective first internal electrical contacts, wherein the first and second IC electrical contacts are configured for electrical connection to the driver IC.

The external electrical contacts are configured for use for input and output connection to a laser package comprising the enclosure. The external electrical contacts are configured for connection to input or output pins, the pins being suitable for insertion into a socket. The internal electrical contacts are configured for connection to circuitry internal to the enclosure.

The number of second IC electrical contacts may be greater than the number of first IC electrical contacts, and the number of first internal contacts may be greater than the number of first external contacts.

The enclosure may comprise second external electrical contacts electrically connected to respective second internal electrical contacts.

The first and second IC electrical contacts may be provided in an external IC contact region of the enclosure that is adjacent to a face of the enclosure and set-back from the face.

The IC contact region may be recessed within the face or comprises a recessed shelf adjacent the face.

The enclosure may further comprise a driver IC provided on the exterior of the enclosure and electrically connected to the first and second IC electrical contacts.

The driver IC may have a serial data input, a plurality of digital to analogue converters, and a plurality of analogue signal outputs, wherein the IC is operable to convert a serial data signal received at the serial data input into a plurality of analogue data signals at the output.

The driver IC may be operable to control an optoelectronic component within the enclosure.

The driver IC may be operable to control a tunable laser within the enclosure.

The driver IC may be adjacent to a face of the enclosure and a face of the driver IC opposite to the enclosure is flush with or set-back from the face of the enclosure.

The enclosure may further comprise a tunable laser electrically connected within the enclosure.

According to a second aspect, there is provided a laser package comprising an enclosure for a laser package, the enclosure being configured to receive a laser component within the enclosure, and further configured to receive for a driver integrated circuit (IC) on the exterior of the enclosure, wherein the enclosure comprises first external electrical contacts electrically connected to respective IC input electrical contacts, and output IC electrical contacts electrically connected to respective first internal electrical contacts, wherein the first and second IC electrical contacts are configured for electrical connection to the driver IC, and further comprising a driver IC provided on the exterior of the enclosure and electrically connected to the first and second IC electrical contacts, and a tunable laser provided within the enclosure and electrically connected to the first internal electrical contacts.

The laser package may be dimensioned to be received within an optical transceiver module that is one or more of:
a. hot-swappable; and
b. compliant with the SFP MSA standard; and
c. compliant with the XFP MSA standard.

According to a third aspect, there is provided an optical transmitter module compliant with the SFP or XFP MSA standard comprising an enclosure for a laser package, the enclosure being configured to receive a laser component within the enclosure, and further configured to receive a driver integrated circuit (IC) on the exterior of the enclosure, wherein the enclosure comprises first external electrical contacts electrically connected to respective IC input electrical contacts, and output IC electrical contacts electrically connected to respective first internal electrical contacts, wherein the first and second IC electrical contacts are configured for electrical connection to the driver IC, and further comprising a driver IC provided on the exterior of the enclosure and electrically connected to the first and second IC electrical contacts, and a tunable laser provided within the enclosure and electrically connected to the first internal electrical contacts.

BRIEF DESCRIPTION OF THE DRAWINGS

Exemplary embodiments of the invention will now be described with reference to the accompanying drawings, in which.

DETAILED DESCRIPTION OF PREFERRED EMBODIMENTS

In the described embodiments, like features have been identified with like numerals, albeit in some cases having one or more increments of integer multiples of 100 to denote different embodiments. For example, 1, 101 and 201 refer to enclosures of the first, second and third embodiments respectively.

Specific embodiments of the invention will now be described. The embodiments are examples and as such do not represent an exhaustive record of all of the ways in which the invention could be implemented. The law does not require, and it would be prohibitive to describe and illustrate every possible variation and combination of the way in which the invention could be put into effect. The detailed description of each of the exemplary embodiments contains specific details in order to provide the reader with an understanding of the invention; however the invention may be implemented without these particular details.

The present invention relates generally to laser packages, such as those for forming TOSA modules in optical transceivers, and particularly to those for forming tunable TOSA modules. Such laser packages have input and output electrical channels, by which they are operable to generate a photonic output. Laser packages in the following description refer to a combined laser module, a driver integrated circuit (IC) and associated additional components that may comprise one or more laser focussing lenses, isolators, thermoelectric cooling components, interconnects and vias, as well as a physical enclosure defining a volume within which a majority of these components are mounted. The XFP standard is one standard set by the MSA regarding the functionality and physical dimensions of optical transceivers. Another standard is the SFP (Small Form-factor Pluggable) standard, also defined by the MSA. In both cases the optical transceivers are required to be hot-swappable, which is to say they may be disconnected and reconnected whilst the communication system is running.

Types of laser modules include gas lasers, solid-state lasers, liquid lasers, free electron lasers, and semiconductor lasers. Typically lasers comprise a laser cavity formed of an optical gain medium and employ some means for providing optical feedback. The gain medium amplifies electromagnetic waves in the cavity by stimulated emission to result in an amplified beam of light that may be emitted from the laser cavity. In semiconductor lasers, a semiconductor active region provides the laser cavity and performs as a gain medium. Semiconductor lasers include bipolar (diode) lasers and unipolar (non-diode) lasers such as quantum cascade lasers. Tunable semiconductor laser modules are operable to emit a photonic output at a controllably selected one of multiple possible wavelengths, an example of which is that disclosed in U.S. Pat. No. 7,145,923 (the tunable laser module of which is herein incorporated by reference). The control of the selected wavelength is achieved by setting one or more parameters for the laser module, which parameters effect consequent control over the photonic output. Such parameters are generally selected through electrical inputs to the laser module, though additionally temperature may also act as a parameter. These different parameters require a number of separate electrical control lines to communicate to the tunable laser module. In order to connect the laser package to the optical transceiver (or transmitter) of which it forms a part, the laser package uses input/output (I/O) pins. These I/O pins take up a physical quantity of area both internally and externally of the laser package.

In the present invention, a laser package is provided that has a laser module and a driver IC for driving the laser module that is mounted on an exterior surface of an enclosure component of the laser package. By mounting the driver IC in such a manner, and by communicating with that driver IC using a serial data protocol that requires relatively few control lines, such as the I²C protocol described in U.S. Pat. No. 4,689,740, it is possible to increase the number of control inputs, in order to control a laser having an increased number of separately electrically controllable sections, without increasing the number of I/O pins provided on the laser package. The driver IC translates a received data signal into a plurality of control signals to control the laser module. For example, the driver IC receives a serial, digital data stream, such as an I²C format signal, and outputs a plurality of analogue control signals. Preferably, the driver IC is an application specific integrated circuit (ASIC) designed to provide a requisite level of speed and stability.

By mounting the driver IC externally, the heat generated by the driver IC does not require to be removed from within the enclosure of the laser package, and any effect it might have upon the components within the enclosure is greatly reduced compared with an internally mounted driver IC. Further, external provision of the driver IC enables thermal contact to be made between the driver IC and a heat sinking portion of a housing into which the laser package is inserted for operation improving heat dissipation from the driver IC. Yet further, mounting the driver IC externally may avoid compromising the internal volume of the laser package compared with an internally mounted driver IC.

Figure 1A:
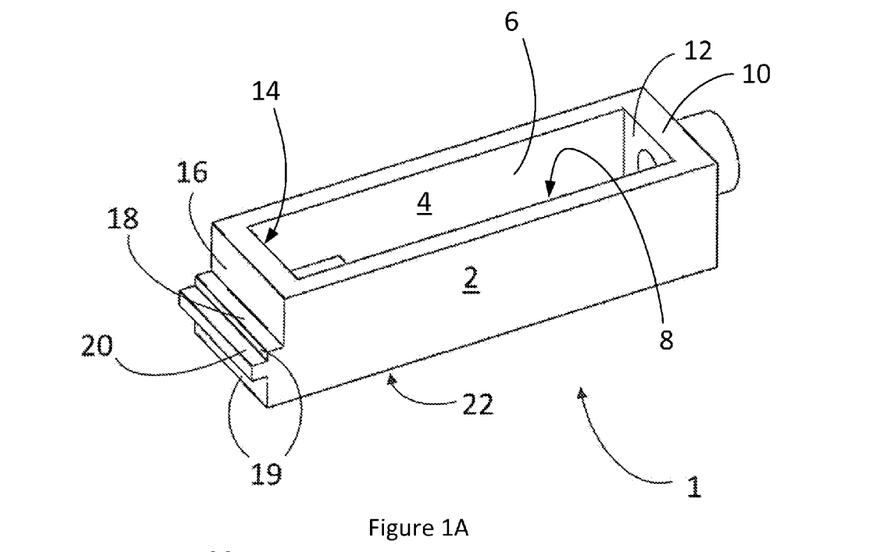
FIG. 1A illustrates an isometric view of an enclosure for a laser package according to a first embodiment of the present invention.
Figure 1B:
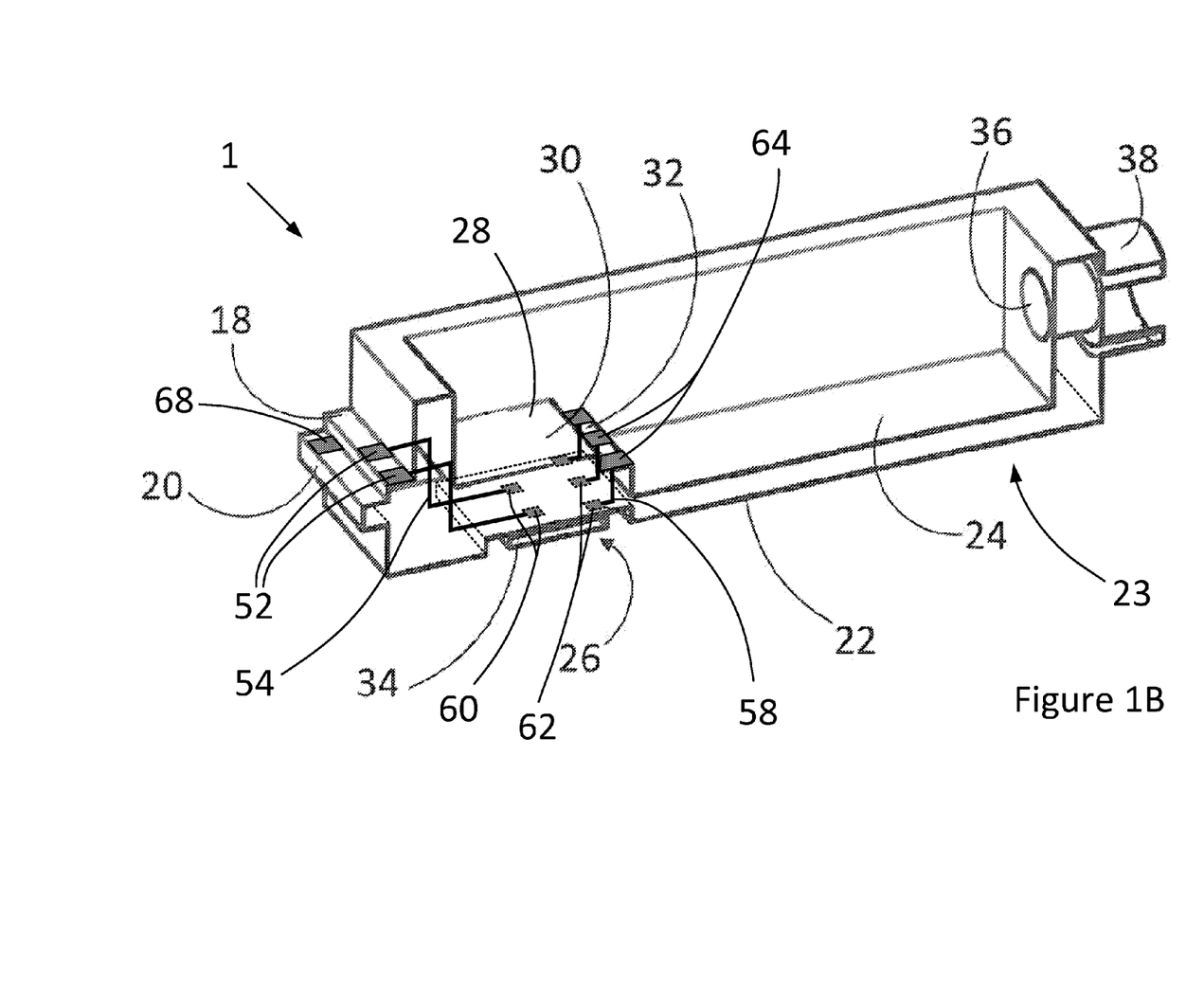
FIG. 1B illustrates a cut-away side view through the longitudinal axis of the enclosure of FIG. 1A.

FIGS. 1A, 1B, 1C and 1D illustrate an enclosure 1 and a laser package according to a first embodiment of the present invention (in FIGS. 1A and 1B the enclosure is illustrated with the top cover removed for clarity).

The enclosure 1 is formed of Low Temperature Co-fired Ceramic (LTCC) or High Temperature Co-fired Ceramic (HTCC). Both LTCC and HTCC are multi-layer technologies used in the microelectronics packaging industry. Each layer is processed in parallel and then assembled into an accurately aligned stack before firing. LTCC is advantageous for radio-frequency and high-frequency applications. By including one or more of resistors, inductors, capacitors, and active components in the same package, LTCC can be used to produce multi-layer hybrid integrated circuits. Compared to HTCC, in LTCC the ceramic is generally fired at a lower temperature (below 1000° C.) due to a special composition of the material. Thus the co-firing may include highly conductive materials such as, amongst other, silver, copper and gold. By embedding passive elements, such as resistors, capacitors and inductors, into the ceramic, the package size may be minimized. In addition, resistors may be added to the top layer of the resulting package post-firing, for example by screen printing a resistive paste. HTCC packages generally consist of multiple layers of alumina oxide with tungsten and moly-manganese metallization. This ceramic material is fired at higher temperatures than LTCC (around 1600° C.). Compared to LTCC, the conductive layers of HTCC have higher resistance that those achievable using LTCC. Advantageously though, HTCC provides a package that has mechanical rigidity and hermeticity, both of which are important in high-reliability applications such as optical transceivers. Another advantage is the higher thermal dissipation capability of HTCC.

Electrically conducting material may be provided as electrical tracks on layers of the enclosure and as electrical vias through layers of the enclosure to provide electrical paths on and through the assembled enclosure between the contacts and components of the laser package. The layers may also comprise embedded passive components such as resistors, capacitors and inductors to minimise the volume of the circuitry within the interior volume of the enclosure.

The enclosure 1 has opposed first 2 and second 4 side walls interconnected by opposed first 10 and second 16 end walls. A bottom wall 22, as best shown in FIG. 1B, extends between the first 10 and second 16 end walls to enclose a bottom portion of the enclosure 1. The enclosure is also provided with a cover (lid), which is omitted from the figures for clarity. The enclosure is elongate along the length defined from the first end wall 10 to the second 16 end wall. The first side wall 2, second side wall 4, bottom wall 22 and cover are approximately parallel to the direction of elongation.

Extending perpendicularly from the surface of the second end wall 16 is a first shelf 18 which terminates in a surface 19 parallel to the second end wall 16. A second shelf 20, narrower than the first shelf 18, extends from this surface 19. The first 18 and the second 20 shelf each provide a series of electrical contacts (pads) 52 and 68 (for clarity only exemplary contacts are shown) for input and/or output electrical connection to an electrical control system, e.g. the external contacts 52 and 68 are the laser package control contacts. These external electrical contacts 52 and 68 are conductive surfaces that facilitate electrical connection between the electrical paths 54 and 56 defined on and through layers of the enclosure 1 and individual leads or input/output (I/O) pins 92 that are attached to the external electrical contacts. These leads may be flexible PCB connection leads that may terminate in electrical connection to a connector that is receivable by a complementary connector of an optical transceiver (or transmitter). Alternatively, the connector may be a portion of circuit board forming a part of the optical transceiver. The pads are used, as necessary, for input or output purposes and may be bi-directional.

The enclosure 1 defines an interior volume between inner surfaces 8, 6, 12, 14, 24 of the first side wall 2, second side wall 4, first end wall 10 and second end wall 16, the bottom wall 22, and the inner surface of the lid (not shown). The inner surface 24 of the bottom wall comprises a first raised portion 32, and a second raised portion 30, forming two successively stepped platforms relative to the plane of the inner surface 24. The bottom wall 22 of the enclosure 1 comprises an internally indented portion 26 (i.e. a recessed region) formed by an offset surface 28 that is offset internally into the bottom 22 of the enclosure 1, in vertical alignment below the first 32 and second 30 raised portions.

Electrical paths 54 and 58 are formed on and through the bottom wall 22 and the second end wall 16. The paths 54 and 58 comprise electrical tracks along the surface of the layers from which the enclosure 1 was formed and electrical vias that provide electrical connections through one or more layers. The electrical paths 54 electrically connect between the external contacts 52 and the IC first (input) electrical contacts 60, and the further electrical paths 58 electrically connect between the IC second (output) electrical contacts 62 and the internal electrical contacts 64. Accordingly, there are a corresponding number of external contacts 52 and IC first (input) electrical contacts 60, and a corresponding number of IC second (output) electrical contacts 62 and internal electrical contacts 64.

Optionally, a layer of Cu—W forms the bottom wall 22 of the enclosure 1 for advantageously facilitating heat transfer from the internal volume, and the electrical paths are provided in other walls of the enclosure.

A driver IC 34 is provided within the indentation (recessed region) 26 in the lowermost surface of the bottom wall 22 of the enclosure 1. The driver IC 34 is received completely within the aperture of the indentation 26 so that it does not extend beneath the lower surface 23 of the bottom wall 22 of the enclosure 1. The inputs and outputs of the driver IC 34 are electrically connected to the IC input electrical contacts 60 and the IC output electrical contacts 62, and so are in electrical communication with the external electrical contacts 52 and the internal electrical contacts 64, through the electrical paths 54 and 58 within the bottom wall 22 of the enclosure 1.

A bore 36 is provided through the first end 10 of the enclosure 1 for communication between an interior volume of the enclosure 1 and an external channel 38 formed as a circular collar. An optical fibre stub 72A is received into the external channel 38 and aligned to optically couple to optical components within the enclosure. The external channel 38 is configured to receive the pluggable end 74 of an optical fibre 72B of an optical fibre network, which optically couples with the optical fibre stub 72A.

Figure 1C:
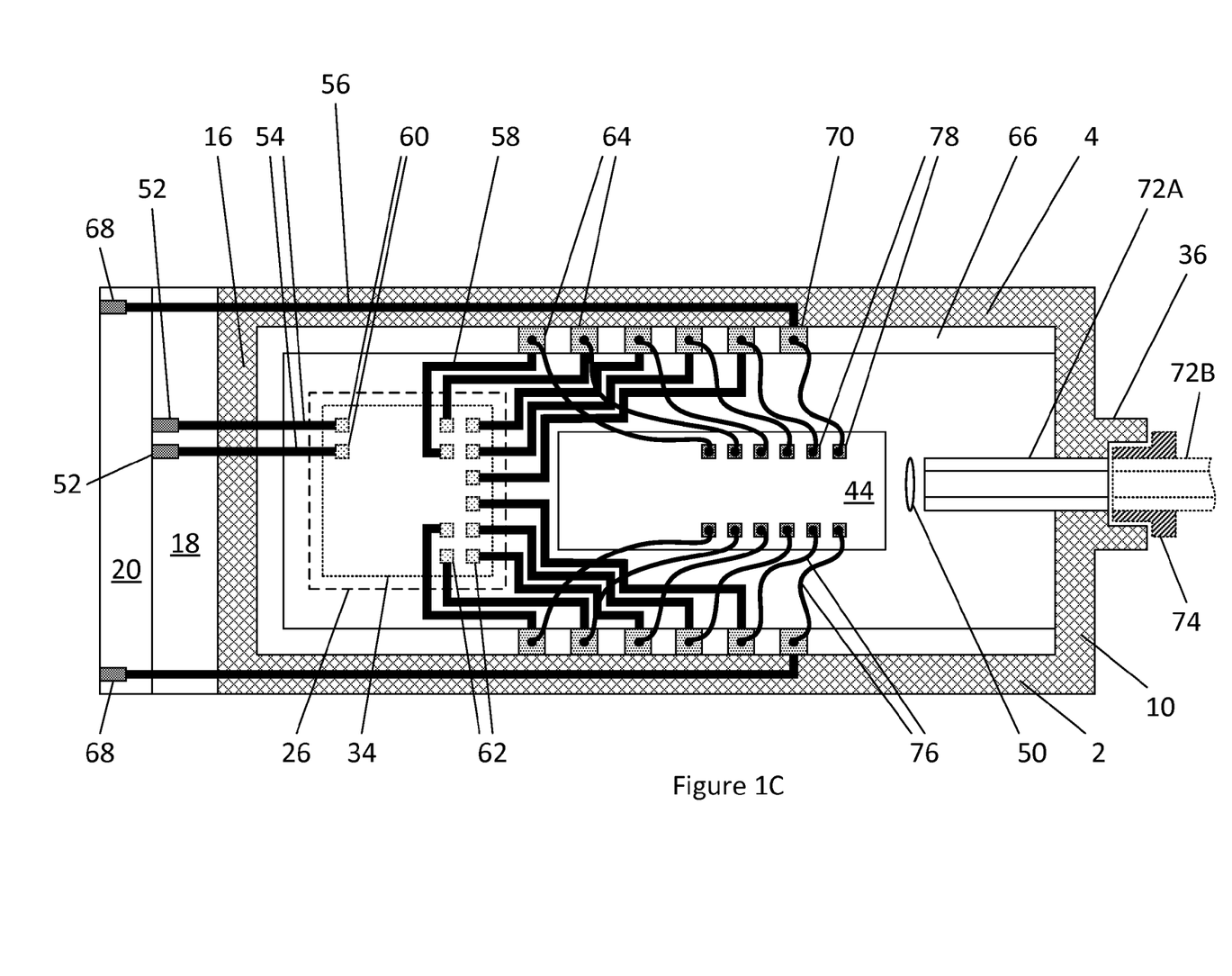
FIG. 1C illustrates a plan view through a laser package comprising the enclosure of FIG. 1A, prior to the attachment of a lid.

FIG. 1C illustrates a laser package largely similar to that of FIGS. 1A to 1C. The laser package is further provided with a shelf 66 running along walls 2, 4 and 16 of the enclosure 1.

The internal contacts 64 may be located on the shelf 66. Further electrical paths 56 are provided between further external electrical contacts 68 and further internal electrical contacts 70, without electrically connecting to or from the driver IC 34. Accordingly, there are a corresponding number of further external electrical contacts 68 and further internal electrical contacts 70.

A ceramic substrate 44 (including a tunable laser module) is shown connected within the laser package, and wire bonds 76 provide electrical communication between the internal electrical contacts 64 and the further electrical contacts 70 and substrate electrical contacts 78. Accordingly, by the application of electrical signals to the external electrical contacts 52 and further external electrical contacts 68 it is possible to operate the internal circuitry on the substrate 44, such as the laser module.

By use of the use of the driver IC 34, the electrical paths 58 to the substrate 44, and thus to the tunable laser module, are shorter than would otherwise be the case with connections from a separate driver through direct connections from the first and second shelves 18 and 20. Accordingly, the control signals to a component on the substrate 44 may experience less electrical noise, compared with direct connections from the first and second shelves.

Figure 1D:
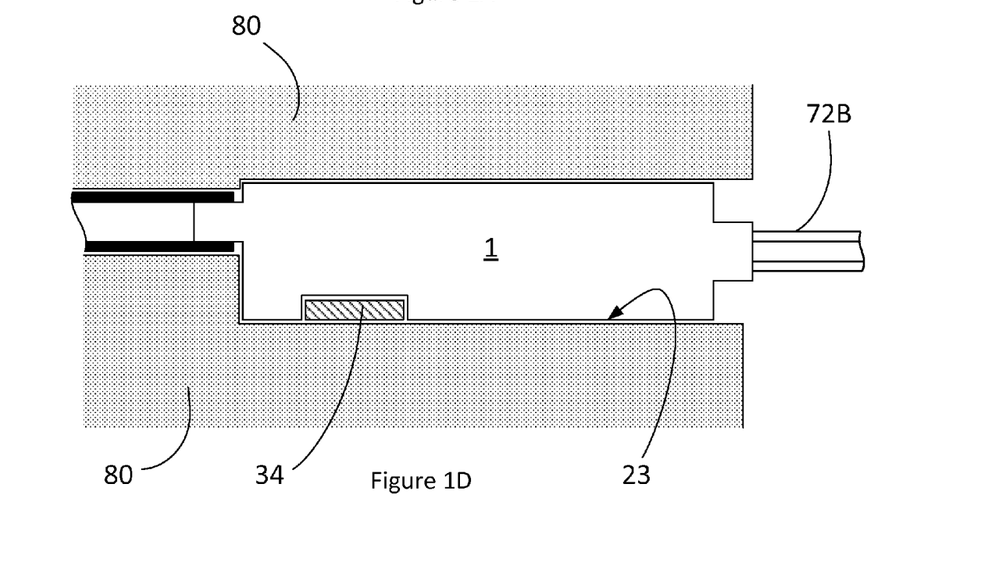
FIG. 1D illustrates a side view of the laser package of FIG. 1A mounted within a housing.

FIG. 1D illustrates a side view of a laser package received into a housing 80. The driver IC 34 is flush with the outer surface 23 of the bottom wall 22 of the enclosure 1. The housing 80 is provides thermally conductive contact between the driver IC 34 and the housing, to promote the dissipation of heat from the driver IC.

A second preferred embodiment of a laser package is now considered with reference to the illustrations of FIGS. 2A to 2F. This second embodiment is similar to the first embodiment, with the exception of location of the recessed region for receiving the driver IC. Like numerals are used to refer to like features common to the first and second embodiments, with reference numerals for this second embodiment incremented by "100" to denote this second embodiment.

Figure 2A:
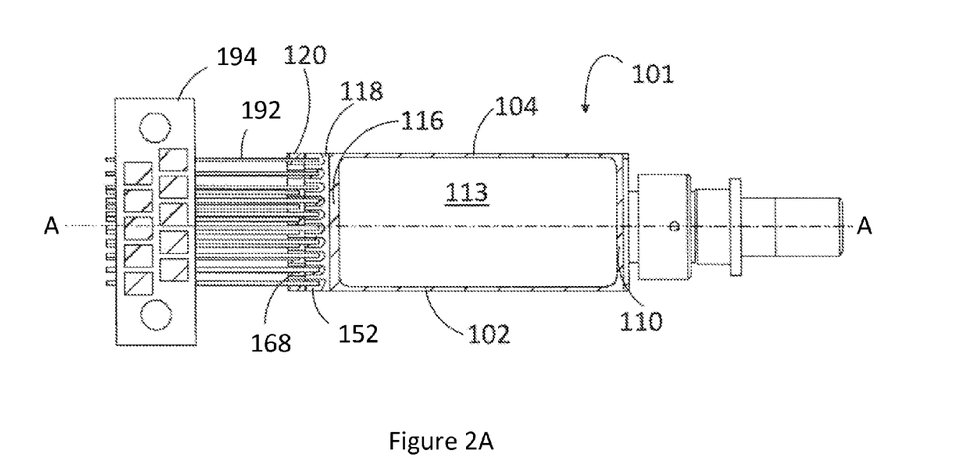
FIG. 2A illustrates a plan view of an enclosure according to a second embodiment of the present invention.

FIG. 2A is a plan view of a laser package showing the a lid (cover) 113 of the enclosure 101 that is mounted upon upper edges of opposed first 102 and second 104 side walls interconnected at respective ends by opposed first 110 and second 116 end walls. The cover (lid) may be formed of a Kovar® (nickel iron cobalt alloy) material and may be seam welded to the contacting edges of the walls of the enclosure 1. Electrical connection pins 192 are soldered to the external electrical contacts 152 and 168, for insertion into an electrical socket 194.

Figure 2B:
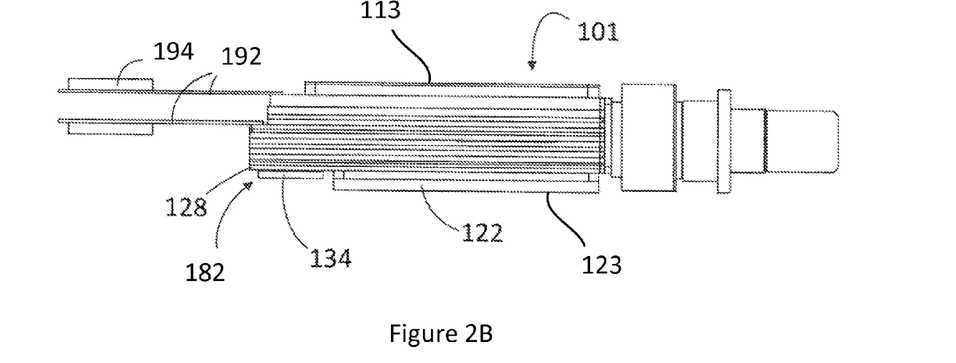
FIG. 2B illustrates a side view of the laser package of FIG. 2A.

FIG. 2B shows the laser package of FIG. 2A when viewed from the opposite side (i.e. the opposite side from the lid). In contrast to the enclosure of the first embodiment, which has an indentation into the bottom wall, the enclosure 101 of the second embodiment has a recessed shelf 182 adjacent the lower surface 123, onto which the driver IC 134 is mounted.

Figure 2C:
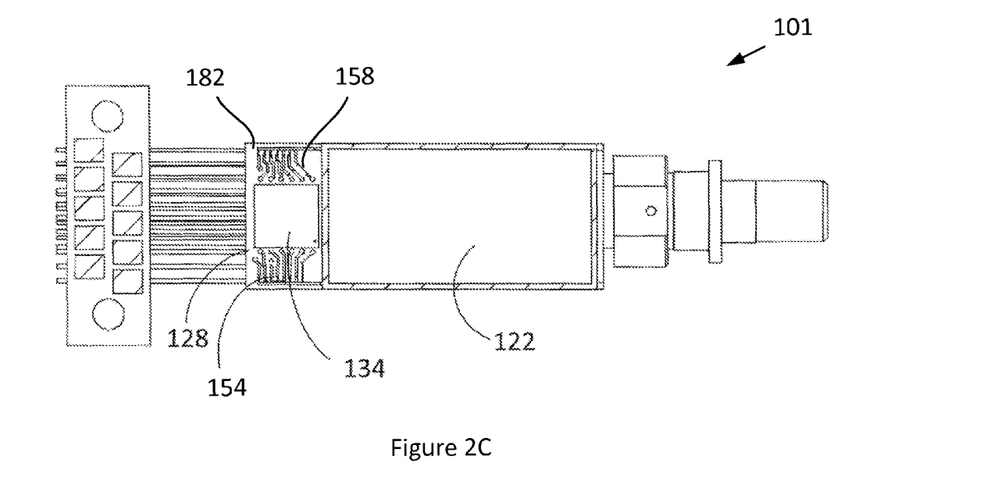
FIG. 2C illustrates a bottom view of the laser package of FIG. 2A.

FIG. 2C shows the laser package of FIG. 2A when viewed from the opposite side (i.e. the opposite side from the lid), further illustrating the recessed shelf 182 onto which the driver IC 134 is mounted.

Figure 2D:
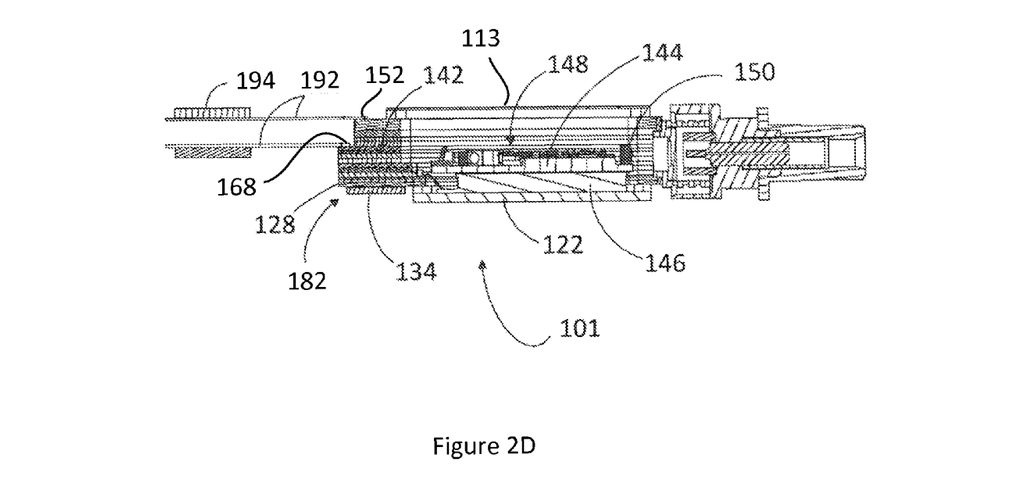
FIG. 2D illustrates a cut-away side view of a laser package comprising the enclosure of FIG. 2A through a longitudinal axis thereof.

The complete enclosure (i.e. with the cover fixed in place) provides a hermetically sealed interior volume that houses the internal circuitry and optical components of the laser package. FIG. 2D illustrates a cut-away side view of the laser package corresponding to line A-A of FIG. 2A. The cut-away view reveals the internal layering of the enclosure 101, which is formed from multiple layers 142 of a material such as ceramic.

Figure 2E:
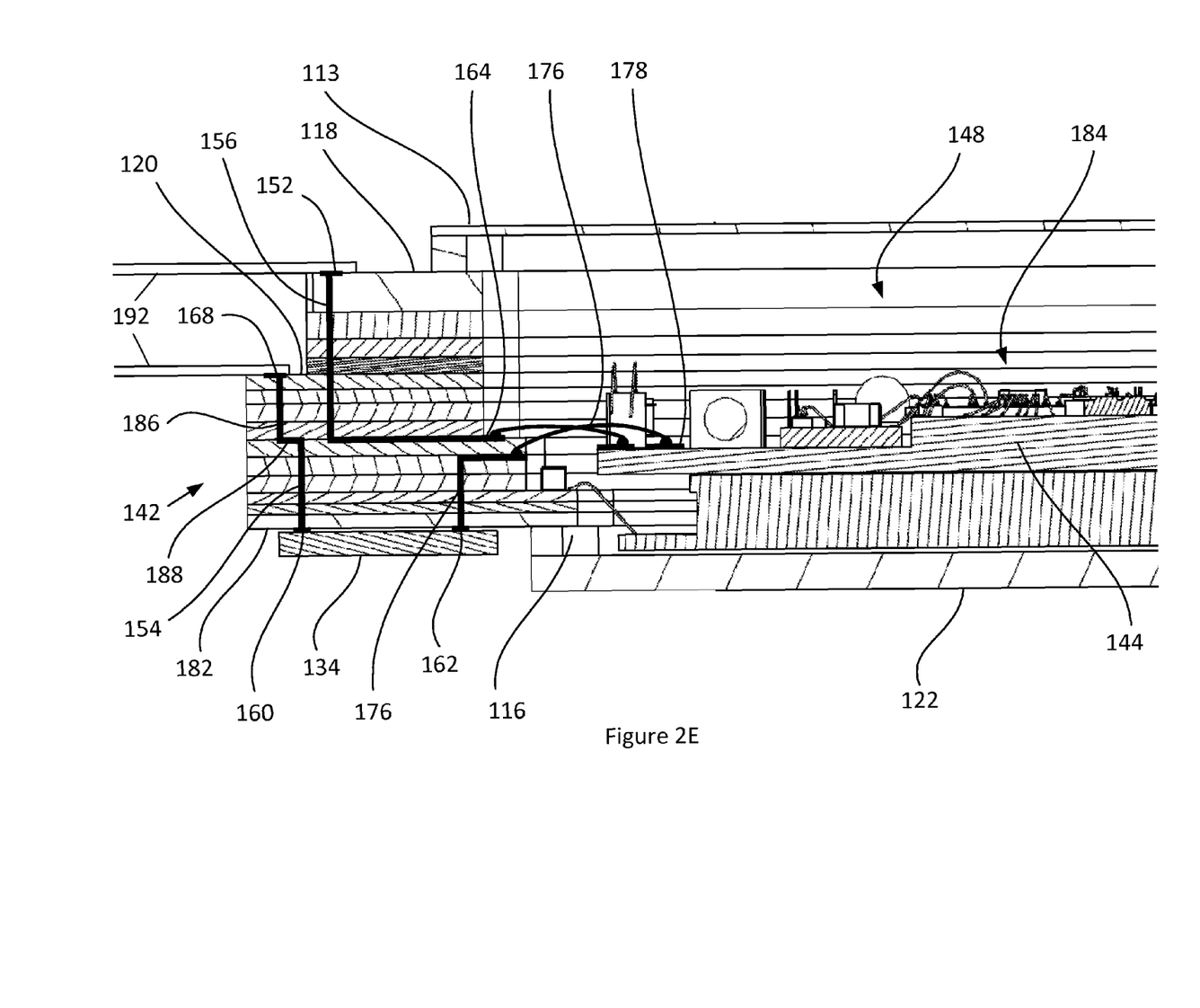
FIG. 2E illustrates an enlarged view of part of FIG. 2D.

FIG. 2E shows an enlarged view of part of FIG. 2D, further indicating some exemplary electrical paths 154, 156 and 158 through the multiple layers 142 of the enclosure 101. These electrical pathways interconnect the external electrical contacts (pads) 152 and 168, the driver IC 134 and the circuitry 148 disposed within the internal volume thereof. The electrical paths are provided by interconnecting electrical vias 186 through the multiple layers 142 from which the enclosure 101 is formed, and electrical tracks 188 parallel to those layers. Accordingly, the electrical paths 154, 156 and 158 enable electrical communication between the external electrical contacts 152 and further electrical contacts 168 and the driver IC 134 and the internal circuitry 148, both directly and indirectly by the driver IC.

The internal circuitry 148 comprises, amongst other components, a tunable laser module 184 and a laser focussing lens 150 mounted upon a substrate, such as a ceramic substrate 144 that is disposed upon a thermoelectric cooler 146. The thermoelectric cooler 146 is disposed on the bottom wall 122 of the enclosure 101.

A recessed shelf 182 of the enclosure 101 is adjacent to and recessed relative to the lower surface 123 of the bottom wall 122, and extends from the second end wall 116. On this recessed shelf 182 a driver IC 134 is located such that it is wholly contained with recessed shelf 182. The bottom wall 122 of the enclosure 101 thus provides a lowermost surface 123 of the enclosure 101, upon which the laser package may rest without the driver IC 134 being in contact with any other surface than the underside of the indentation 126 to which it is secured. Alternatively, the recessed shelf 182 may be offset from the lower surface 123 by a lesser extent, such that the side of the driver IC opposite to the enclosure 101 is flush with the lower surface 123.

The layers 142 provide electrical pathways from the electrical contacts (pads) 152 on the first 118 and/or second 120 shelf of the enclosure 101 to the first electrical contacts 160 of the driver IC 134. In this manner, serial data may be passed to the driver IC 134, which then operates to translate that serial data into output electrical signals at the second electrical contacts 162 of the driver IC. These second electrical contacts 162 are connected to internal electrical contacts 164, through electrical paths 158. The internal electrical contacts 164 are in electrical communication with the internal circuitry 148 such as the tunable laser 184, amongst other components, through wire bonds 176. Similarly, further electrical paths 156 pass directly between further external electrical contacts 168 and the internal circuitry 148 without communicating with the driver IC 134. The driver IC 134 may comprise multiple current output digital to analogue converters (DACs) which DACs output current along multiple control lines leading to the internal circuitry 148, such as the laser module 184. The driver IC 134 also comprises an integrated serial communication interface for receiving serial data, such as I²C data from two input channels (SCL and SDA, for example, that may be open collector or open drain channels and that may comprise pull-up resistors), allowing connection to a remote microprocessor.

The serial interface allows the DACs' output to be configured as required in correspondence with the control data received through the serial control lines. The DACs have internal registers to track the required output signals, which registers can also be read back by the remote microprocessor along with DAC configuration and status information, via one or more output channels that are connected to one or more of the external electrical contacts 168 or 152 of the enclosure 101.

The electrical control lines to a tunable laser module 184 within the internal circuitry 148, from the driver IC 134, may comprise a signal line, a bias line, a ground line and a plurality of wavelength selection lines. The bias line may be either a current or a voltage depending on the nature of the tunable laser module. The wavelength selection lines may similarly be current or voltage based. For example, for use with a distributed Bragg Reflector laser, the wavelength selection lines may comprise lines that provide currents to cause refractive index changes in segments of a distributed Bragg Reflector, whilst a further of the wavelength selection lines provides a current to cause refractive index change in a phase control section of the laser. Thus the presence of the driver IC 134 can reduce the number of control lines required to be connected to the external electrical contacts 152.

Figure 2F:
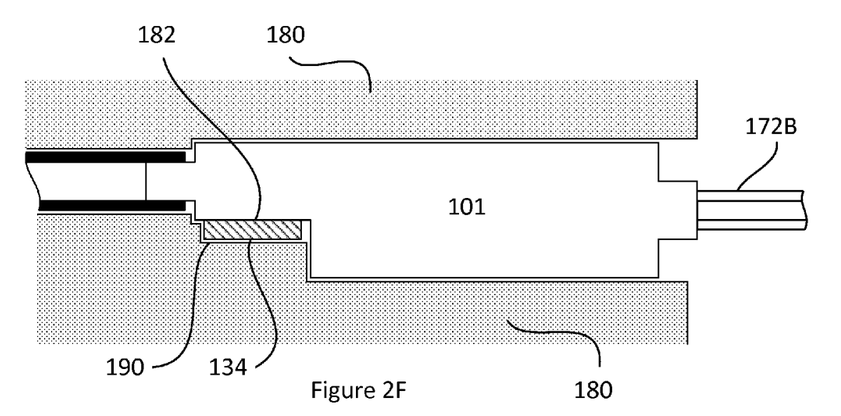
FIG. 2F illustrates a side view of the laser package of FIG. 2A mounted within a housing.

The positioning of the driver IC 134 on an external surface of the enclosure 101 can provide more room within the internal volume of the enclosure for the internal circuitry 148, such as the tunable laser module 184 compared with a driver IC located within the interior of the enclosure. In addition, the exterior positioning of the driver IC 134 provides for superior heat dissipation from the driver IC, compared with a driver IC within the interior of the enclosure, which may be directly thermally coupled to a heatsink of the optical transceiver, or to the housing of the optical transceiver. FIG. 2F illustrates a housing 180 shaped in correspondence with the laser module such that the ledge 190 of the housing provides thermal communication with the surface of the driver IC 134 to enhance thermal dissipation from the driver IC.

The recessed shelf 182 of the enclosure 101 upon which the driver IC 134 is secured preferably comprises vias 186 through the layers from which the enclosure is formed, with the vias arranged in a pad layout (not shown) so as to allows a chip sized package driver ASIC having, for instance, solder ball connections along a proximate surface thereof, to be electrically linked to the vias 186 through heating of the solder balls (also known as an electrical "flip-chip connection").

Figure 3:
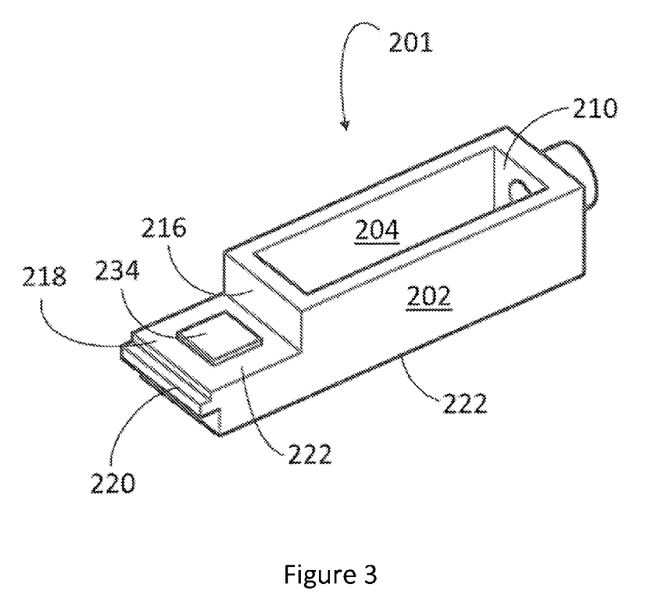
FIG. 3 illustrates an isometric view of an enclosure for a laser package according to a third embodiment of the present invention.

A third embodiment of an enclosure, shown in FIG. 3 provides an enclosure 201 that is similar in constructional details to the first and second embodiments above. Like numerals are used for like features of the third embodiment, incremented by "200" with respect to the first embodiment, and incremented by "100" with respect to the second embodiment.

The first shelf 218 of the enclosure 201 extends a sufficient distance from the perpendicular surface of the second end wall 216 as to allow the mounting of a driver IC 234 thereupon. Accordingly, as well as providing external electrical contacts (not shown) the first shelf 218 also provides the recessed shelf upon which the driver IC 234 is mounted, in contrast to the separate recessed region 26 (internally indented portion) or recessed shelf 182 of the first and second embodiments in which the first shelf and recessed region or shelf are separate. The lowermost surface of the bottom 222 of the enclosure 201 may be planar, and the inner surface (not shown) of the bottom wall 222 of the enclosure 200 may also be planar, without a requirement for any raised portions. The first shelf 218 provides a layout of external electrical contacts connected to electrical vias (not shown) for accepting the driver IC 234 and the layers of the ceramic forming the enclosure 201 provide electrical paths by which those vias are electrically connected to external and internal electrical contacts and in electrical communication with the internal circuitry, such as a tunable laser module, when fitted within the enclosure 201.

It is contemplated that the features of the three embodiments described above may be combined with one another where desired, and each embodiment should not be considered to be independent from the others. Variations to the features of the exemplary embodiments may be incorporated as desired without departing from the scope of the invention as set out in the claims.

It is contemplated that the enclosure may be formed of some other material that multi-layer ceramic. Whilst the use of ceramic is convenient to provide of routing of electrical pathways, it is envisaged that the enclosure may be formed of a plastics material or a metal (subject to suitable electrical isolation where appropriate). In the absence of electrical pathways defined in the layers of the enclosure, separate electrical pathways would need to be provided through wiring or similar.

It is further contemplated that the recessed region (e.g. indentation or recessed shelf) in the exterior of the enclosure may be formed in a different location on the respective wall, or indeed a different wall altogether, relative to those that are described above.

The placement of the electrical contacts in the above embodiments is exemplary and it is contemplated that they may be moved, or that the shelves upon which they are disposed may be altered as desired. For example, the first shelf may be in the same plane as the top of the enclosure, or alternatively it may be recessed slightly thereto. The presence of a second shelf is optional depending on the number of external electrical contacts required.

Whilst the above described provision of a driver IC is particularly advantageous in relation to tunable laser packages, this is not a limiting feature of the invention and it is contemplated that the use of the driver IC such as that described above may be employed with other laser types.

Use of directional indicators in the foregoing, such as "top", "bottom", "sides", "up", "down" etc are used solely for the purposes of clarity of explanation and are not limiting features of the present invention.

The invention claimed is:

1. An enclosure for a laser package, the enclosure being configured to receive a laser component within the enclosure, and further configured to receive for a driver integrated circuit (IC) on the exterior of the enclosure, wherein the enclosure comprises first external electrical contacts electrically connected to respective first IC electrical contacts, and second IC electrical contacts electrically connected to respective first internal electrical contacts, the enclosure further comprising a shelf that externally extends from the enclosure, wherein the first and second IC electrical contacts are configured for electrical connection to the driver IC, and wherein the enclosure and first external electrical contacts are configured to be hot-swappable for receiving by a cage mounted on a printed circuit board, and at least one of the first external electrical contacts is placed on the surface of the shelf.

2. The enclosure according to claim 1, wherein the number of second IC electrical contacts is greater than the number of first IC electrical contacts, and the number of first internal contacts is greater than the number of first external contacts.

3. The enclosure according to claim 1, wherein the enclosure comprises second external electrical contacts electrically connected to respective second internal electrical contacts.

4. The enclosure according to claim 1, wherein the first and second IC electrical contacts are provided in an external IC contact region of the enclosure that is adjacent to a face of the enclosure and set-back from the face.

5. The enclosure according to claim 4, wherein the IC contact region is recessed within the face or comprises a recessed shelf adjacent the face.

6. The enclosure according to claim 1, further comprising a driver IC provided on the exterior of the enclosure and electrically connected to the first and second IC electrical contacts.

7. The enclosure according to claim 6, wherein the driver IC has a serial data input, a plurality of digital to analogue converters, and a plurality of analogue signal outputs, wherein the IC is operable to convert a serial data signal received at the serial data input into a plurality of analogue data signals at the output.

8. The enclosure according to claim 7, wherein the driver IC is operable to control a wavelength tunable laser within the enclosure.

9. The enclosure according to claim 6, wherein the driver IC is adjacent to a face of the enclosure and a face of the driver IC opposite to the enclosure is flush with or set-back from the face of the enclosure.

10. The enclosure according to claim 1, further comprising a wavelength tunable laser electrically connected within the enclosure.

11. A laser package comprising an enclosure according to claim 1, further comprising a driver IC provided on the exterior of the enclosure and electrically connected to the first and second IC electrical contacts, and a wavelength tunable laser provided within the enclosure and electrically connected to the first internal electrical contacts.

12. A laser package according to claim 11, wherein the laser package is dimensioned to be received within an optical transceiver module that is one or more of:
 a. hot-swappable; and
 b. compliant with the SFP MSA standard; and
 c. compliant with the XFP MSA standard.

13. An optical transmitter module compliant with the SFP or XFP MSA standard comprising a laser package according to claim 12.

* * * * *